United States Patent [19]
Malloy

[11] Patent Number: 4,878,018
[45] Date of Patent: Oct. 31, 1989

[54] ELECTRICAL TESTING DEVICE

[76] Inventor: James T. Malloy, 50 Swede Creed Rd., Oak Run, Calif. 96069

[21] Appl. No.: 131,924

[22] Filed: Dec. 11, 1987

Related U.S. Application Data

[63] Continuation-in-part of Ser. No. 834,367, Feb. 28, 1986, abandoned.

[51] Int. Cl.⁴ .................. G01R 1/06; G01R 31/02
[52] U.S. Cl. .................. 324/158 F; 324/158 P; 324/73 PC; 324/72.5
[58] Field of Search .............. 324/158 P, 158 F, 72.5, 324/73 PC; 439/481, 324, 912, 482

[56] References Cited

U.S. PATENT DOCUMENTS

| | | | |
|---|---|---|---|
| 3,493,853 | 2/1970 | Baron et al. | 324/72.5 X |
| 3,731,191 | 5/1973 | Bullard et al. | 324/72.5 X |
| 4,063,172 | 12/1977 | Faure et al. | 324/158 F X |
| 4,086,465 | 4/1978 | Sylvester | 439/481 X |
| 4,518,910 | 5/1985 | Hottenrott et al. | 324/158 F X |
| 4,544,888 | 10/1985 | Kvaternik | 324/158 F X |
| 4,686,464 | 8/1987 | Elsasser et al. | 324/158 F X |

OTHER PUBLICATIONS

Bruder et al; "Dual Buckling Beam Connectors for Test Probes;" IBM Technical Disclosure Bulletin; vol. 17, No. 2; Jul. 1974; pp. 638–639.

Lipschutz et al; "Buckling Wire Probe Asembly"; IBM Technical Disclosure Bulletin; vol. 15, No. 10, Mar. 1973; pp. 3032–3033.

Primary Examiner—Reinhard J. Eisenzopf
Assistant Examiner—Vinh P. Nguyen
Attorney, Agent, or Firm—John J. Connors

[57] ABSTRACT

An electrical test system is provided including a plurality of parallel probes made of a spring quality, wire-type conductive material having a diameter ranging between 0.001 and 0.050 inch. The probes are carried in a housing which moves them towards and away from an electronic component being tested. Each probe extends into a housing between the housing and the electronic component being tested, and each probe has a bend in its end which engages the housing wall and permits the housing to move the probe in and out of a conductive tubular member. Preferably, the tubular members are moved sideways as the housing is moved toward and away from the component being tested. The ends of the probes in the tubular member engage the side wall of these members to provide electrical contact.

8 Claims, 3 Drawing Sheets

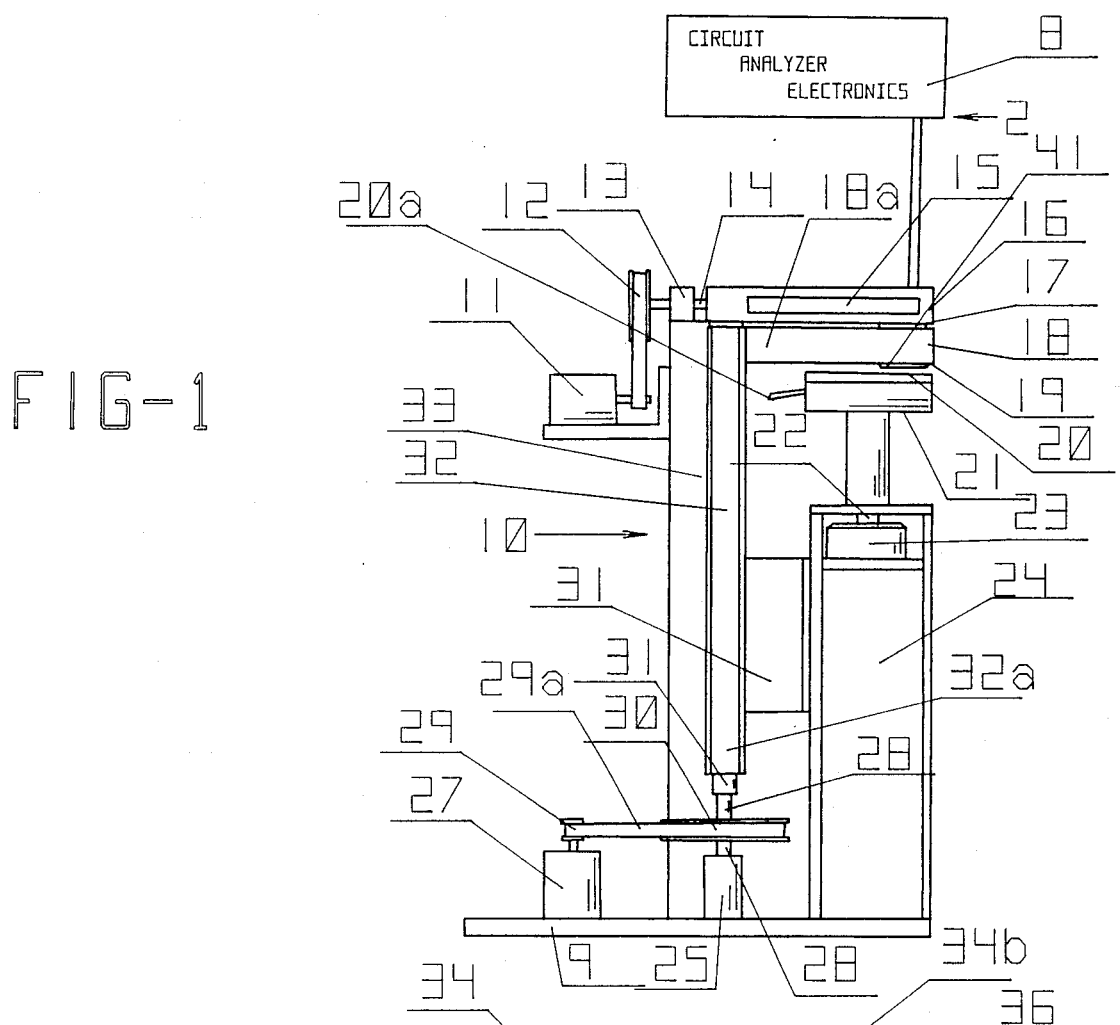
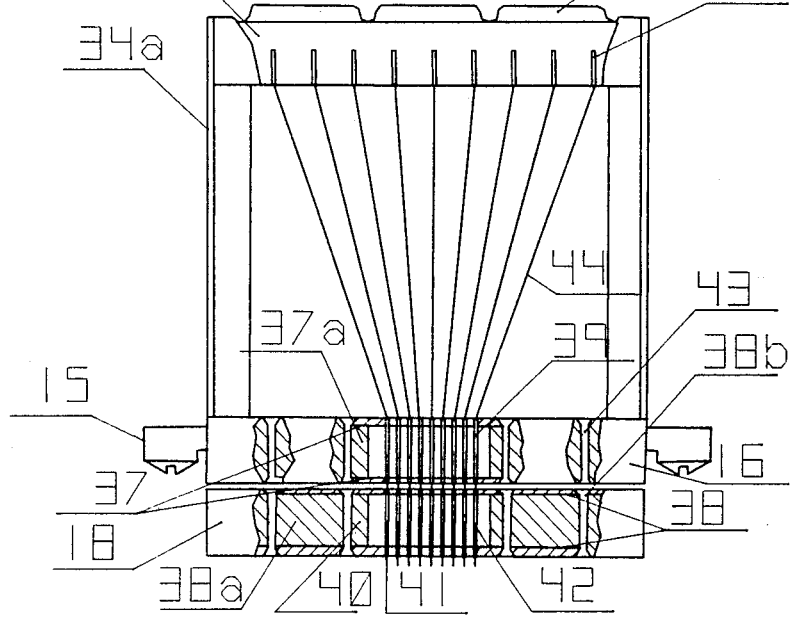

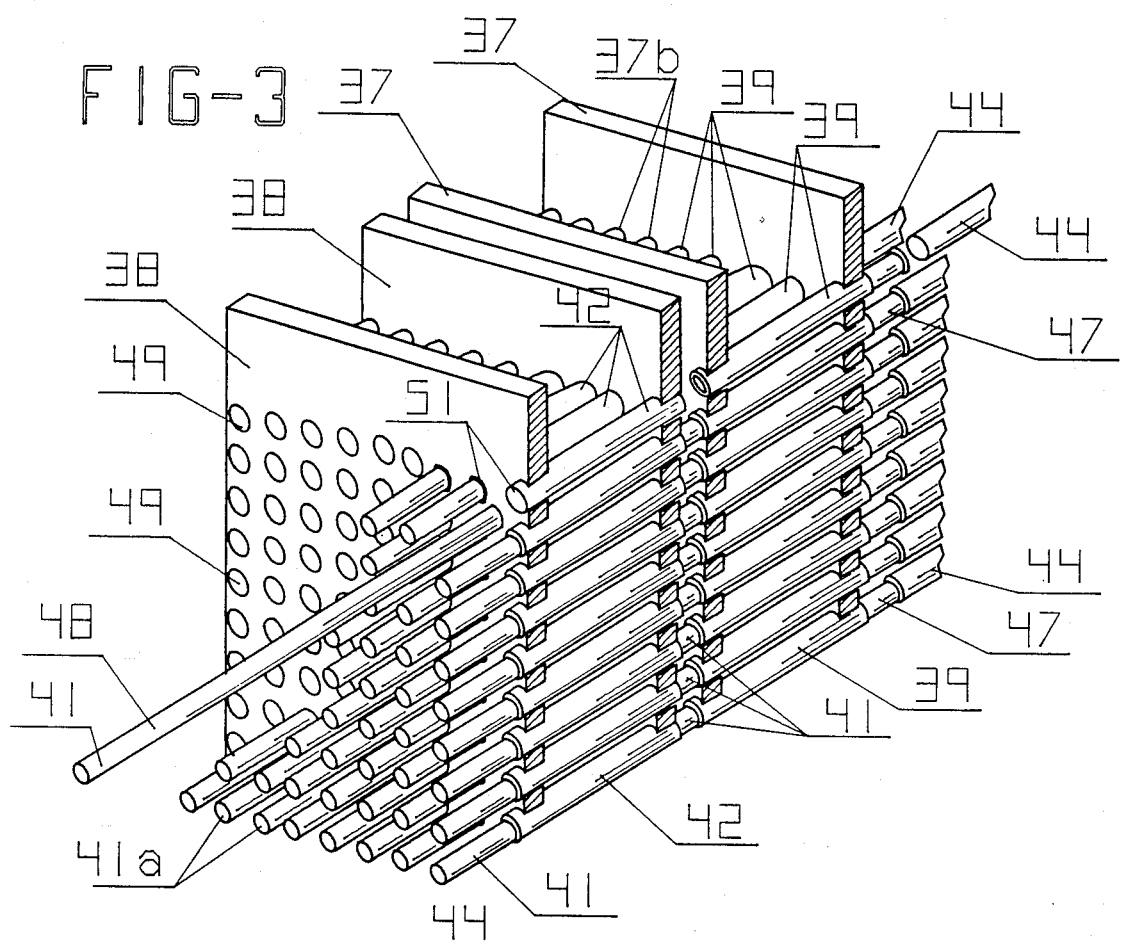
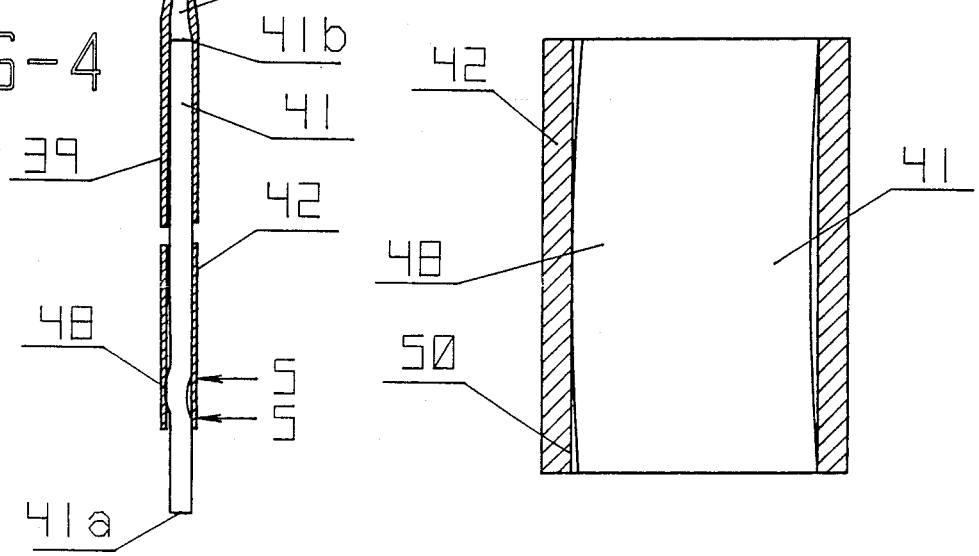

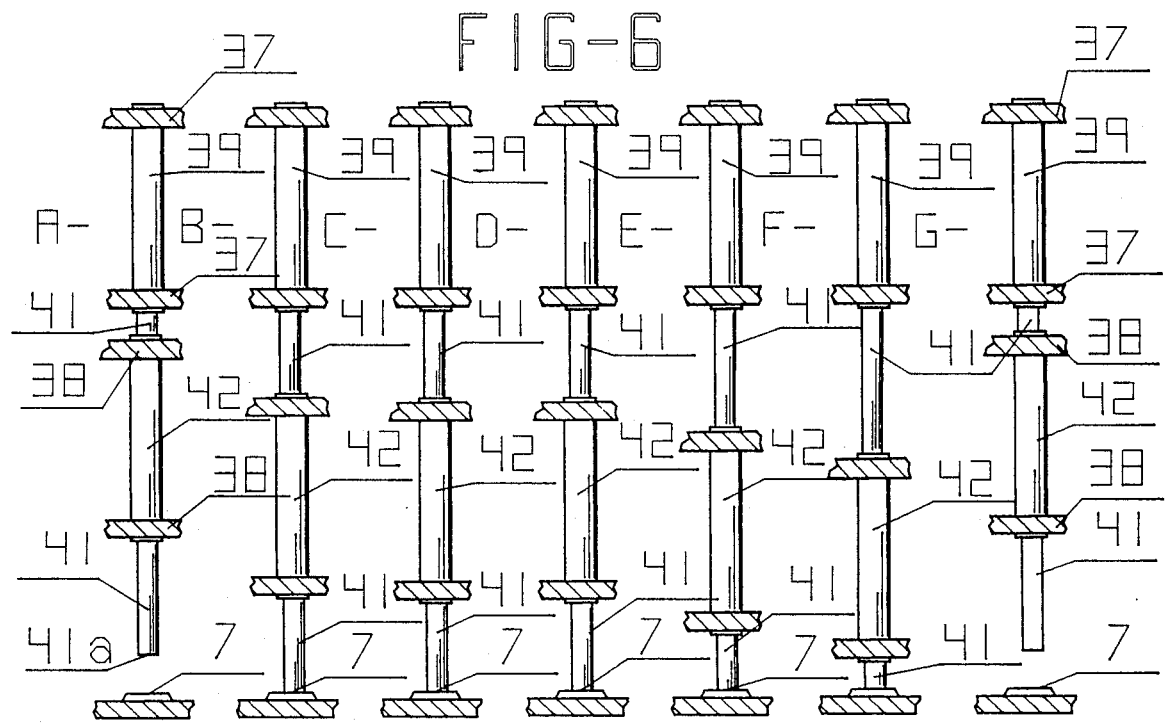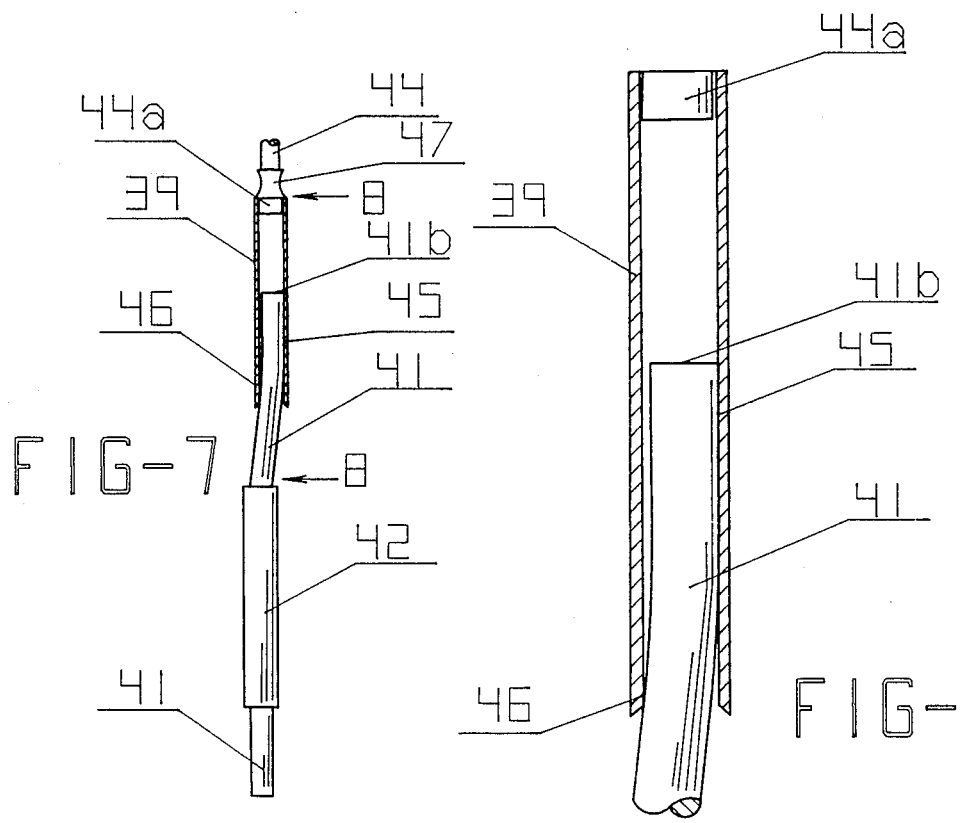

ELECTRICAL TESTING DEVICE

RELATED PATENT APPLICATIONS

This patent application is a continuation-in-part of U.S. Pat. application Ser. No. 06/834,367, filed Feb. 28, 1986, now abandoned, entitled A SYSTEM FOR TESTING A CIRCUIT BOARD. This previously filed patent application is incorporated herein by reference and made a part of this patent application.

BACKGROUND OF THE INVENTION

1. Field of the Invention:

This invention relates to an electrical testing device, particularly an electrical testing device for testing electrical components having test points closely spaced together a distance of 0.050 inch and closer.

2. Background Discussion:

It is common practice in the manufacture of electrical components to do quality assurance testing on the components using circuit analyzer which determines if the electrical connections and circuits for the components are in correct operating order. A testing device is employed having a plurality of probes which engage the electrical component under test. These probes are electrically connected to the circuit analyzer.

With the advent of integrated circuits, the test points have been placed in greater proximity to each other, so that it is typical that adjacent test probes may be as close as 0.050 inch or even closer. In designing a probe type testing device to engage the component under test several problems are presented. When high density, for example more than 400 test points per square inch, are encountered, it is difficult to stack together in close proximity all the probes necessary to make individual contact with the test points. Even when stacking is accomplished, conditions often occur during testing where individual probes will contact one another resulting in shorting.

SUMMARY OF THE INVENTION

The present invention provides a probe-type testing device adapted to contact closely spaced adjacent test points in a high density test point configuration which is highly reliable.

There are several features of this invention which contribute to its reliability, no single one of which is solely responsible for this desirable attribute. Without limiting the scope of the invention as expressed by the claims, its prominent features will now be discussed briefly. After considering this discussion, and particularly after reading the section of this application entitled DETAILED DESCRIPTION OF THE PREFERRED EMBODIMENT, one will understand how the features of this invention provide the attribute of high reliability.

One feature of this invention is the use of a plurality of probes aligned with each other generally in parallel and being made of spring quality wire-type conductive material. A suitable material would be a beryllium copper alloy. Typically, the probes will have a circular cross-section although other cross-section configurations for the probes would be acceptable. The typical diameter of the probes will range between 0.001 and 0.050 inch.

The second feature is that the probes are arranged in a support and closely stacked together with the individual probes being in registration with individual test points. Typically, adjacent test points are spaced apart a distance ranging between 0.005 inch and 0.05 inch.

The third feature of the invention is that each probe is disposed within a movably mounted housing which has an open tip which receives a free end of the probe, that is, the probe end opposite the end of the probe which contacts the test point. Each probe has a bend in it which engages the inside wall of the housing. Thus, when the housing is moved either towards or away from the test point, it moves the probe because of the friction contact between the bend in the probe and the wall of the housing.

The fourth feature of this invention is that there is provided for each probe an electrical connector in registration with the probe with the probe being disposed between the electrical connector and the test site. The electrical connectors include a conductive tubular member having an open end and opposed to said open end an electrically contact. The contact is connected electrically to the circuit analyzer. As the probe is moved towards and away from the test points, it moves within the electrically conductive tubular member and bears against the inside wall of the tubular member to make electrical connection.

The fifth feature of this invention is that the electrically conductive tubular members are carried in a structure adapted to move reciprocably side to side as the probes are moved towards and away from the test points. This further insures that good electrical contact is made between the probes and the tubular members. Because the probes are made of spring quality wire they have a high degree of resiliency and spring back to their normal condition when the probes are returned to their starting position.

BRIEF DESCRIPTION OF THE DRAWING

The preferred embodiment of this invention is described in detail in connection with the accompanying drawing, in which like parts are given like numerals and in which:

FIG. 1 is a side-elevational view of a circuit analyzer system employing the probe type test device of this invention.

FIG. 2 is a side elevational view taken along line 2—2 of FIG. 1, with sections broken away.

FIG. 3 is a perspective view, schematically illustrating the arrangement of the probes in the test device of this invention.

FIG. 4 is a cross-sectional view of an individual probe carried in the housing and conductive tubular member.

FIG. 5 is an enlarged, fragmentary view taken along line 5—5 of FIG. 4.

FIG. 6 is a schematic illustration showing the probe moving through a test cycle through positions A through G.

FIG. 7 is a side elevational view, partially in section, showing the probe in the housing and conductive tubular member in position E of FIG. 6.

FIG. 8 is an enlarged, fragmentary view taken along line 8—8 of FIG. 7.

DESCRIPTION OF THE PREFERRED EMBODIMENT

The probe type system 10 of this invention is shown in FIG. 1 wherein spring quality wire-type conductive probes 41 are carried by a power head 18. The system 10 includes the power head 18, a cross head 16, and a test bed 20 mounted beneath the probes 41.

The cross head 16 is connected to a stepping motor 11 through a screw-type drive shaft 14 carried in a collar 13. A sprocket drive 12 connects the shaft 14 to the stepping motor 11 so that the cross head 16 may be driven in a stepwise fashion to the right or left by the stepping motor. The cross head 16 is mounted on a frame 33 which is supported by a base 9. The cross head 16 includes guide bearings 15 which ride along rails (not shown) as the cross head moves to the left or to the right. This movement of the cross head 16 is in short incremental steps preferably ranging between 0.00001 and 0.010 inc.

The test bed 20 is carried in a test bed housing 21 which is supported by a rod 22. The rod 22 is connected to a load cell 23 which rests on top of a compartment 24 holding the control electronics for the system 10. The power head 18 is disposed between the cross head 16 and the test bed 20 and it is supported by a column 32 connected to the one end 18a of the power head. The lower end 32a of this column 32 has a nut 31 that engages a screw 28. The screw 28 is connected to a sprocket 30 and a bearing 25. A stepping motor 27 having its output 29 connected by belt drive 29a to the sprocket 30 turns the screw 28 either clockwise or counterclockwise to lower and raise the power head 18. Guide members (not shown) guide the support column 32 as it moves up and down as the screw 28 is turned. The test bed 20 has a vacuum hose 20a extending outwardly from it which may be used to apply a vacuum to an electrical component (not shown) placed on the test bed immediately below the probes 41.

As best shown in FIGS. 2 and 3, the probes 41 pass through the power head 18 and extend into the cross head 16. The support structure for the probe 41 includes two plates 38 having insulated spacers 38a disposed between them with screws 38b securing the plate and spacer assembly together. The support plates 38 are made of an insulated material and have a plurality of holes 49 drilled therein. The holes 49 in the two separate plates 38 are aligned with one another and carry individual tubular housing elements 42. These housing elements 42 are made of a conductive material, however, this is optional. Instead of using the support plates 38, spacers and housing elements 42, parallel aligned holes in the insulator plates could be used as well to support the probes 41.

The cross head 16 includes a pair of plates 37 which are separated by insulated spacers 37a and connected together by screws 43 to create the cross head assembly. The individual plates 37 have a series of holes 37b drilled therein which receive conductive tubular members 39. The tubular members 39 are aligned with corresponding housing elements 42, with individual probes 41 passing through the housing elements 42 into tubes 39. The number and arrangement of the probes 41 as well as their spacing will correspond to the number and spacing of the test points in the electronic component to be tested. Thus, when the probes 41 move downwardly toward the component carried on the test bed, individual probes will contact the test points in registration with the test point contact ends 41a of the probes.

The ends 39a (FIG. 4) of each of the conductive tubular members 39 is crimped at 47 to connect electrically these tubular members with individual wires 44. The wires 44 extend outwardly from the cross head 16 and are connected to flexible cable 34b (FIG. 2) which are attached to a hardboard 34. The hardboard 34 is carried in a frame 34a and has leads (not shown) which are in electrical connection with the flexible cables 34b and electrically connect the wires 44 to the circuit analyzer electronics 8.

In accordance with this invention, each individual probe 41 has a bend 48 therein at the lower section of the probe near its test point contact end 41a as illustrated in FIGS. 4 and 5. This bend frictionally engages the inside wall 50 of the housing element 42. Thus, when the power head 18 is moved up or down, the frictional contact between the bend 48 and the wall 50 cause the probe 41 to move up and down as well. When the contact end of 41a of the probe engages the test point, pressure can be applied downwardly by the power head 18. This will cause the wall 50 to slide over the bend 48, overcoming the frictional force between the wall 50 and the bend 48, but applying a downward pressure sufficient to insure contact between the end 41a and a test point 7 (FIG. 6). Conversely, when the power head 18 is moved away from the test point 7 in an upward direction, the frictional contact between the wall 50 and the bend 48 in the probe 41 causes the end 41a to lift off the test point 7 and the probe to move upwardly. When the upper end of the probe 41 engages the end of the wire 44a, as illustrated in FIG. 4, the housing element 42 will slide over the bend 48, since the end 44a of the wire 44 acts as a stop to prevent further upward movement of the probe 41.

OPERATION

The system 10 of this invention operates as follows:

First, the electronic component being tested is placed on the test bed 20 with the individual test points 7 aligned underneath the ends 41a of the probes 41. As shown in FIG. 6, the probes 41 are initially in position A, which corresponds to the position of the probe shown in FIG. 4. Vacuum is drawn on the vacuum line 20a to hold the electronic component in position so that it will not move during testing. Next the stepping motor 27 is energized to turn the screw 28 moving the column 32 downwardly carrying the power head 18 with it, moving the individual probes 41 toward the electronic component being tested. When the ends 41a engage the individual test sites 7, the power head 18 is now in the position illustrated in position B of FIG. 6. Initially, the end 41a simply contacts the test point 7. As soon as a slight pressure is applied to the load cell 23, the control electronics in compartment 24 switch on the stepping motor 11. This condition corresponds to position C is FIG. 6. The power head 18 is continued to be moved in the downward direction to apply force to the probe 41, moving the housing 42 downwardly over the bend 48 from position D to position E. Simultaneously, stepping motor 11 moves the cross head 16 to the right as indicated by the arrow in FIG. 6. This will cause the probe 41 to bend as shown in FIGS. 7 and 8. This insures contact between the probe 41 and the conductive side wall of the tubular housing 39 at site 45. It is desirable to move the cross head sideways in the fashion, but not required. The test is conducted for a predetermined time period, for example, 15 seconds, under an applied pressure which is controlled by the load cell 23 sensing the pressure applied to the test bed 20. If the load cell 23 indicates that more pressure is required, the stepping motor 27 will be activated to apply more pressure to the probes 41 by moving the power head 18 downwardly, causing the housing elements 42 to push against the bend 48 and apply downward pressure to the probes 41.

When the test has been completed, the control electronics reverse the direction of the stepping motors 27 and 11. The power head 18 will move upwardly until the end 41b of the probe 41 engages the end 44a of the wire 44. At this time the upward movement of the probe 41 stops. The cross head 16 is moved to the left and the power head 18 continues to move upwardly pulling the housing 42 over the bend 48 returning the housing element to the position A of FIG. 6.

In accordance with one of the major features of this invention, the housing element 42 provides lateral support for the probe 41 as the probe moves towards and away from the test point 7. To insure this support the length of the housing element 42 is adjusted so that the probe will maintain a substantially erect position. The inside diameter of the housing element 42 is sufficient to provide clearance so that the probe 41 will not bind when the housing element slides over the bend 48. The bend 48, however, inhibits relative movement between the housing element 42 and the probe 41 to enable the housing element to carry the probe with it as it moves until the probe engages either the test point 7 or the end 44a of the wire 44.

SCOPE OF THE INVENTION

The above description presents the best mode contemplated of carrying out the present invention as depicted by the preferred embodiment disclosed. The combination of features illustrated in this embodiment provides the reliability of the test system of this invention. This invention is, however, susceptible to modifications and alternate constructions from the embodiments shown in the drawing and described above. Consequently, it is not the intention to limit it to the particular embodiments disclosed. On the contrary, the intention is to cover all modifications and alternate constructions falling within the scope of the invention as generally expressed by the following claims.

I claim:

1. A test system for testing an electronic component including
   a plurality of conductive, wire-type probes, each probe being movably mounted in a housing and each probe having a test end with a bend wherein that engages said housing and a free end, said bend inhibiting the relative movement between the probe and housing,
   means for moving the housing towards and away from the electronic component being tested,
   a plurality of electrical connectors for connecting individual probes to an electronic analyzer, and
   each electrical connector including a tubular member in registration with a probe and having at one end an electrical contact connected electrically to the analyzer and opposed to said one end an open end which receives the free end of the probe.

2. The test system of claim 1 wherein the probes have a diameter ranging between 0.001 inch and 0.050 inch.

3. The test system of claim 1 wherein the individual probes are stacked together in a parallel arrangement with adjacent probes spaced apart from each other a distance ranging between 0.005 inch and 0.05 inch.

4. The test system of claim 1 including means for moving the tubular members sideways as the individual probes are moved toward and away from the electronic component being tested.

5. A circuit analyzer comprising,
   a plurality of electrical test points simultaneously contacted with electrically conductive probes, individual probes being in registration with individual test points and adjacent test points being spaced apart and distance ranging between 0.005 inch and 0.050 inch,
   said probes being aligned with each other generally in parallel and being made of a spring quality, wire-type conductive material having a diameter ranging between 0.001 and 0.050 inch
   each probe being disposed within a movably mounted housing, each probe having a bend therein that engages the housing, and each probe having a test point contact end and a free end, said bend inhibiting the relative movement between the probe and housing,
   means for simultaneously moving the housing of each probe towards and away from the test points,
   an electrical connector for each probe for individually connecting each probe to the circuit analyzer, and
   each electrical connector being in registration with an individual probe, with each probe being disposed between the test point and the connector of said probe, and each electrical connector including a conductive tubular member having at one end an electrical contact electrically connected to the circuit analyzer and opposite said one end an open tip which receives the free end of the probe.

6. The circuit analyzer of claim 5 wherein the free end of the probe is adapted to engage the electrical connector when the probe is move inwardly toward the contact, with said electrical connector acting as a stop for the probe.

7. The circuit analyzer of claim 6 wherein the tubular member is adapted to move sideways as the probe moves in and out of said tubular member.

8. A circuit analyzer for testing an electronic component having a plurality of closely spaced test points, comprising:
   a plurality of wire-type, parallel probes in registration with individual test points,
   each probe being carried in a movable housing and each probe having a bend therein which engages the housing and which inhibits relative movement between the probe and housing,
   said housing providing lateral support for the probe carried therein and having an inside diameter which provides sufficient clearance to allow the housing to move past the bend when the probe engages a test point, and
   means for moving the housing towards and away from the test points.

* * * * *